United States Patent [19]

Baldi et al.

[11] Patent Number: 4,517,226
[45] Date of Patent: May 14, 1985

[54] METALLIZATION PROCESS OF A WAFER BACK

[75] Inventors: Livio Baldi, Tortona; Aldo Maggis, Vimercate, both of Italy

[73] Assignee: SGS-ATES Componenti Elettronici S.p.A., Catania, Italy

[21] Appl. No.: 503,255

[22] Filed: Jun. 10, 1983

[30] Foreign Application Priority Data

Jul. 29, 1982 [IT] Italy .............................. 22627 A/82

[51] Int. Cl.³ .............................................. B05D 5/12
[52] U.S. Cl. ...................................... 427/90; 427/124; 427/125; 427/383.3
[58] Field of Search ...................... 427/383.3, 404, 125, 427/124, 90

[56] References Cited

U.S. PATENT DOCUMENTS

| | | | |
|---|---|---|---|
| 3,239,376 | 3/1966 | Schmidt | 427/383.3 |
| 3,374,112 | 3/1968 | Danon | 427/383.3 |
| 3,453,724 | 7/1969 | Gilbert | 427/383.3 |
| 3,720,997 | 3/1973 | Black et al. | 427/383.3 |
| 4,293,587 | 10/1981 | Trueblood | 427/90 |

FOREIGN PATENT DOCUMENTS 7313265  10/1963  Japan ................................... 427/90

*Primary Examiner*—Norman Morgenstern
*Assistant Examiner*—Janyce A. Bell
*Attorney, Agent, or Firm*—Cushman, Darby & Cushman

[57] ABSTRACT

On the back of a wafer there are deposited firstly a gold layer and then an aluminium layer (eventually including a small silicon percent). It is finally carried out a thermic treatment at low temperature, which causes the aluminium migration towards the wafer through the gold layer.

6 Claims, 3 Drawing Figures

METALLIZATION PROCESS OF A WAFER BACK

The present invention relates to a metallization process of the back of a silicon wafer, on which there have been realized electronic components, in order to facilitate the fixture there of on suitable headers.

A metallization process of known kind includes the deposition of a thin gold layer (Au) with impurity traces (silicon or boron), which is preferably alloyed by thermic treatment at eutectic temperature (~450° C.).

In such a process the alloy operation is made preferable, if not necessary, by the necessity of avoiding instability phenomena, which would change into a silicon migration through the gold layer and the consequent oxidation of the same silicon. This would affect, as known, the successive welding operation.

On the other hand, the alloy operation is cause of superficial unevenesses, which cause fluctuations of the contact resistance after the welding. Besides it is required to use greater quantities of gold with consequent additional costs.

Another known process includes in its turn the deposition of silicon containing aluminium (Al/Si), which is alloyed by thermic treatment at a temperature lower than the eutectic one and then receives the deposition of a thin gold layer.

With this process the gold quantity, and consequently the cost, is reduced and a better ohmic contact is realized. However there occurs the drawback that the aluminium tends to oxidate very quickly before the deposition of gold, worsening the Al/Au contact.

Both the processes have also the disadvantage to require thermic treatments at temperatures greater than 400° C., which determine reliability problems deriving from the formation of superficial protuberances ("hillocks") in the aluminium layers possibly present on the wafer front.

The object of the present invention is to realize a metallization process of the back of a wafer, which results advantageous with respect to the presently known processes.

According to the invention such an object is reached by means of a process characterized in that it comprises, in succession, the deposition of a first gold layer, the deposition of a second aluminium layer (eventually including a little percent of silicon) and the thermic treatment of the wafer with the two superimposed layers for the migration of the aluminium towards the wafer front through said gold layer.

It has been verified that the process according to the invention offers some important advantages, which can be resumed in this way:

(a) Elimination of the Schottky barrier and consequent good ohmic Si-Al contact, mainly as a result of the fact that the aluminium tends to pass through the gold and to reach the previously doped wafer.

(b) Stabilization of the interface Si-Au, that means that the silicon does not tend to migrate towards the surface through the gold layer, thus oxidating in contact with the atmospherical oxygen.

(c) Welding ease and low electric resistance of contact, due to the fact that the migration of aluminium determines the presence of gold on the surface and at the same time prevents the aluminium oxidation. Particularly, there is made possible the direct welding, without interposition of the so called "preform" plates, to the metallic headers of the ceramic packages, with consequent cost saving.

(d) Possibility of using a thermic treatment of "annealing" at low temperature (lower than the eutectic one) which keeps the Au-Al film uniformity and avoids reliability problems. Such treatment at low temperature is made possible by the fact that there occurs the aluminium migration in the gold layer, but not the alloy formation.

(e) Scribing of the metallized wafer, resulting from the reduced strength of the Au-Al film.

An embodiment of the process according to the invention is illustrated for better clarity, but without any limiting meaning, in the enclosed drawings, in which.

Figure 1:
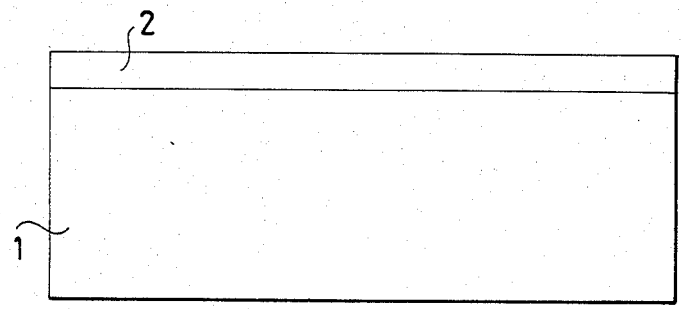
FIG. 1 shows a wafer after the deposition of the gold layer.
Figure 2:
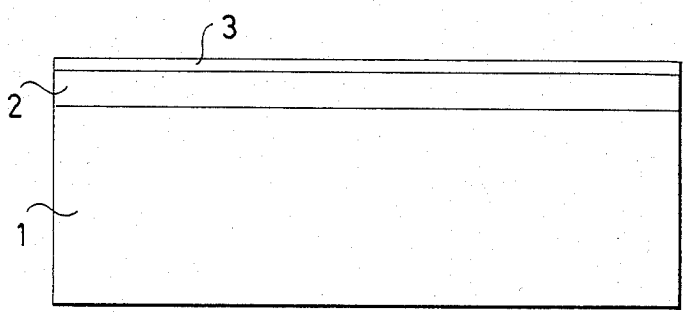
FIG. 2 shows the same wafer after the deposition of the aluminium layer (or Al/Si)

With reference to the drawings, on the back of an opportunely doped wafer 1 of the thickness (for example) of 500÷600 micron it is first deposited (FIG. 1), by vacuum evaporation, a relatively thick gold layer 2 (for example of 0,3 micron), on which it is then deposited (FIG. 2) an aluminium layer 3 (or Al containing traces of Si, which is preferable because it is usually already available in the electronic firms), whose thickness and quantity are chosen in such a way as to avoid the formation of bad intermetallic compounds. The present experiences have shown that the aluminium quantity must not be greater than 50% of that of gold, and that the optimum ratio for the thickness of aluminium and gold must be about 1:6.

Figure 3:
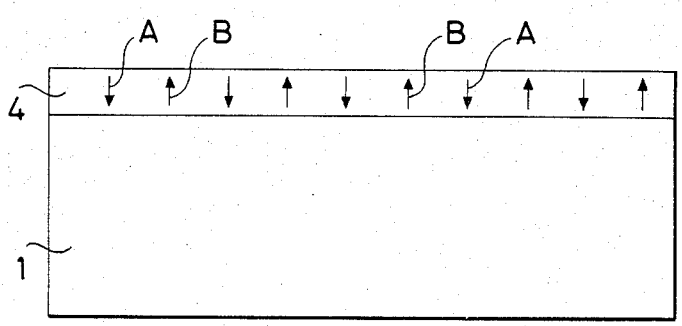
FIG. 3 shows the same wafer after the thermic treatment.

Finally the wafer 1 with superimposed layers 2 and 3 is submitted to a thermic treatment of "annealing" at a temperature (for example ~320° C.) lower than that of the Au-Si eutectic. As consequence, the aluminium migrates through the gold towards the silicon (arrows A of FIG. 3) and the gold migrates towards the outer surface (arrows B of FIG. 3), forming an Au-Al film 4, in which the position of gold and aluminium is practically inverted with respect to the situation of FIG. 2.

We claim:

1. Metallization process of a silicon wafer back, comprising, in succession, the deposition of a first gold layer, the deposition of a second layer of aluminum and the thermic treatment by annealing to temperature lower than the eutectic gold-silicon temperature of the wafer with superimposed layers whereby the aluminum migrates through the gold layer toward the wafer.

2. Process according to claim 1, characterized in that said aluminium layer containes silicon traces.

3. Process according to claim 1, characterized in that said thermic treatment is effected at a temperature lower than that of the gold-silicon eutectic.

4. Process according to claim 3, characterized in that said thermic treatment is effected at a temperature of about 320° C.

5. Process according to claim 1, characterized in that the thickness of said aluminium and gold layers is in a ratio variable about 1:6.

6. Process according to claim 1, characterized in that the quantity of aluminium is not greater than 50% of the quantity of gold.

* * * * *